US006292044B1

(12) United States Patent
Mo et al.

(10) Patent No.: US 6,292,044 B1
(45) Date of Patent: Sep. 18, 2001

(54) LOW POWER GLITCH-FREE CLOCK SWITCH

(75) Inventors: Jiancheng Mo, Allentown; Feng Chen, Bethlehem; Marc Stephen Diamondstein, Allentown, all of PA (US)

(73) Assignee: Lucent Technologies Inc.

( * ) Notice: Subject to any disclaimer, the term of this patent is extended or adjusted under 35 U.S.C. 154(b) by 0 days.

(21) Appl. No.: 09/280,806

(22) Filed: Mar. 26, 1999

(51) Int. Cl.[7] .............................. H03K 1/04; H03L 7/00
(52) U.S. Cl. ......................... 327/298; 327/144; 327/407
(58) Field of Search .................................. 327/298, 141, 327/144, 145, 146, 152, 153, 407, 99

(56) References Cited

U.S. PATENT DOCUMENTS

| | | | | |
|---|---|---|---|---|
| 5,231,636 | * | 7/1993 | Rasmussen | 327/407 |
| 5,623,223 | * | 4/1997 | Pasqualini | 327/144 |
| 5,652,536 | * | 7/1997 | Nookala et al. | 327/407 |
| 5,726,593 | * | 3/1998 | Ruuskanen | 327/407 |

* cited by examiner

Primary Examiner—Toan Tran
(74) Attorney, Agent, or Firm—Jean-Marc Zimmerman

(57) ABSTRACT

A glitch-free clock switch circuit for an integrated circuit having a plurality of asynchronous clocks, wherein only one clock is selected at a time, and wherein the clock switching circuitry for switching from a currently selected clock to an inactive clock to next be selected is activated only for the time it takes to complete the switching. The clock switch circuit includes at least three sets of clock drivers, wherein each set is comprised of two drivers and separate clock drivers are each associated with the output clock, the currently selected clock and the clock to next be selected, respectively. An edge detector turns on these clock drivers in response to a clock select signal, and a set of synchronizers receive and synchronize the clock select signal first with the output clock and then with the currently selected clock and the clock to next be selected, respectively. A plurality of logic gates switches the clock output from the selected clock to the clock to next be selected by the clock select signal. A reset circuit turns off the clock drivers once the clock output has been switched from the selected clock to the clock to next be selected. The clock drivers for clocks that are not selected are turned off during and after the period of time the selected clock is switched to the clock to next be selected. Once the switching is complete, the entire clock switching circuit is turned off until another clock switching occurs.

20 Claims, 4 Drawing Sheets

LOW POWER GLITCH-FREE CLOCK SWITCH

FIELD OF THE INVENTION

The present invention relates to the field of integrated circuit clocks, and more particularly to a low power glitch-free clock switch for selecting between a plurality of clocks in an integrated circuit.

BACKGROUND OF THE INVENTION

A single conventional integrated circuit chip can include a plurality of clocks. Only one of these clocks is selected by the circuit as the system clock at any one time. Having a plurality of clocks enables a single integrated circuit to integrate multiple systems onto one chip, wherein each system has its own clock or clocks, and the clock or clocks of each system are asynchronous to one another. The clock or clocks of one system can temporarily switch to the clock or clocks of another system so that different systems can communicate with one another synchronously. In addition, the plurality of clocks can be programmed to operate at different speeds to control power consumption.

When switching from one clock to another clock, the clock signal must either be in a low logic state (logic zero) or a high logic state (logic one) for a predetermined minimum period of time. If the clock signal is not in a low or high state for at least this minimum period of time, the circuit driven by the clock signal may be prematurely switched. Such an occurrence of a shorter than desired pulse is called a "glitch" which can impede the proper functioning of the integrated circuit.

Several conventional clock switching circuits have been developed that can select among a plurality of asynchronous clocks without producing clock glitches. However, such conventional glitch-free circuits suffer from a significant drawback. Specifically, the clock switching circuit in these circuits is active at all times, thereby unnecessarily consuming power even when switching between clocks does not occur.

SUMMARY OF THE INVENTION

A glitch-free clock switch circuit for an integrated circuit having a plurality of asynchronous clocks, wherein only one clock is selected at any one time, and wherein the clock switching circuit for switching from the selected clock to the clock to next be selected is activated only for the time it takes to complete the switching. The clock switch circuit of the present invention includes at least three sets of clock drivers, wherein a first set of clock drivers is associated with the clock output, a second set of clock drivers is associated with the currently selected clock, and a third set of clock drivers is associated with the clock to next be selected clock. An edge detector turns on these clock drivers in response to a clock select signal, and a plurality of logic gate switches the clock output from the currently selected clock to the clock to next be selected by the clock select signal. A reset circuit is provided for turning off the clock drivers once the clock output switches from the selected clock to the clock to next be selected.

The clock drivers for clocks that are not selected are not activated either during or after switching occurs from the selected clock to the clock to next be selected. Once the switching to the clock to next be selected is complete, the entire clock switching circuit is turned off until another clock switching occurs. Consequently, in situations where clock switching does not occur very frequently, significant power savings result as compared to glitch-free clock switch circuits that remain continuously.

DETAILED DESCRIPTION

Figure 1:
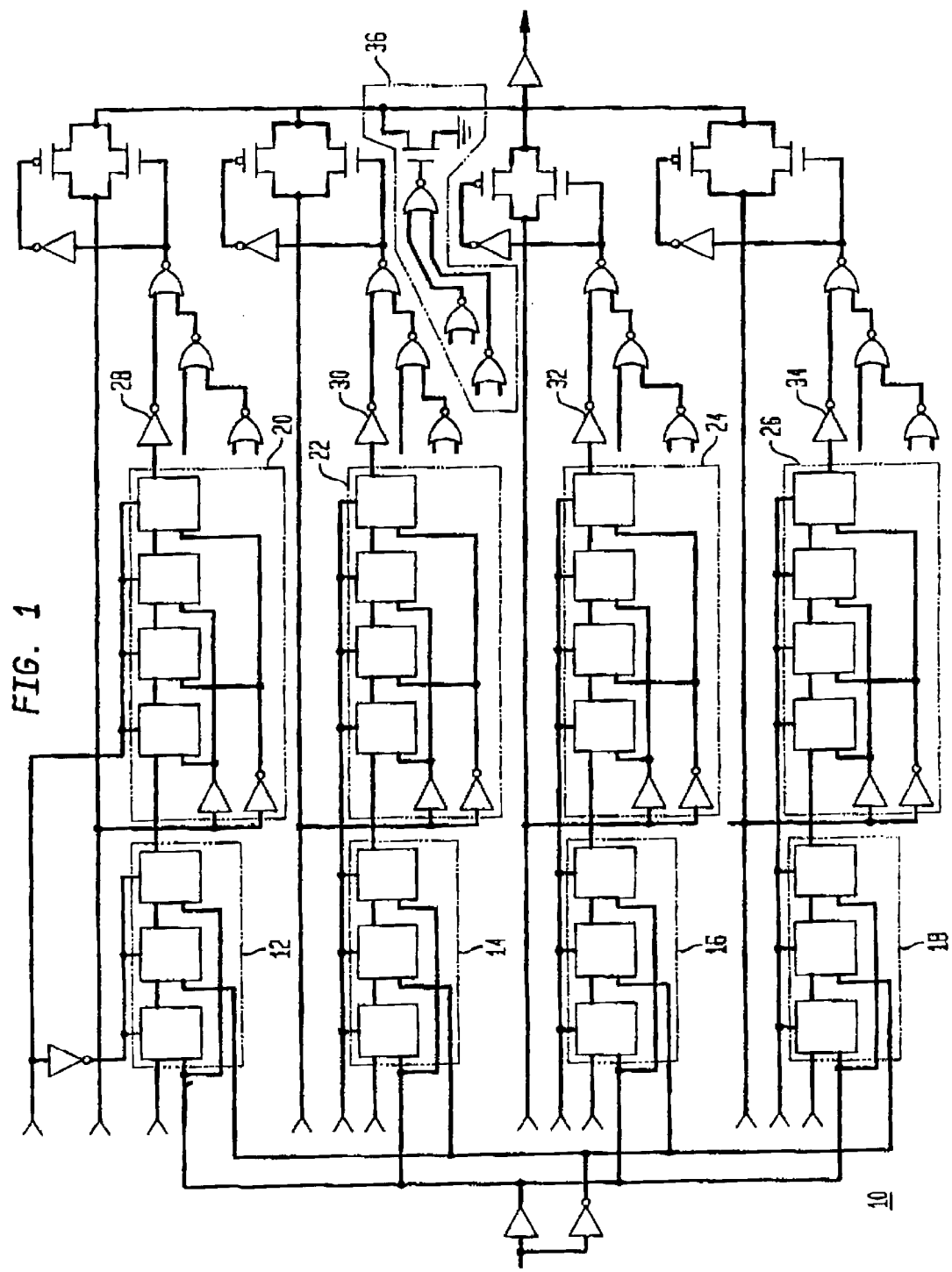
FIG. 1 is a circuit diagram of a conventional prior art glitch-free clock switch circuit.

FIG. 1 shows a prior art glitch-free clock switch circuit 10 used in conventional integrated circuits. Certain functions performed by the present invention are also performed by clock switch circuit 10. Accordingly, a detailed review of the operation of clock switch circuit 10 will aid in understanding the teachings of the present invention. Clock switch circuit 10 allows only one of a plurality of completely asynchronous clocks to be selected at any one time. As shown in FIG. 1, four different asynchronous clock signals CLK1, CLK2, CLK3 and CLK4 are input to clock switch circuit 10.

Clock select signals SEL1, SEL2, SEL3 and SEL4 are used to select one of the four clocks as the current system clock. Clock select signals SEL1, SEL2, SEL3 and SEL4 are each synchronized to the currently selected clock signal CLK_OUT by a different one of four synchronizers 12, 14, 16 and 18, respectively. The outputs of synchronizers 12, 14, 16 and 18 are synchronized signals N11, N21, N31 and N41, respectively.

To change the selected clock, the clock select signal for the currently selected clock is changed from a logic one to a logic zero, and the clock select signal for the clock to next be selected is changed from a logic zero to a logic one. When the corresponding synchronized signal, either N11, N21, N31 or N41, for the selected clock is changed to a logic zero, and the synchronized signal for the clock to next be selected is changed to a logic one, signal CLK_OUT is stopped and held in a predetermined logic state. The synchronized signals N11, N21, N31 and N41 are then synchronized to the corresponding clock signals CLK1, CLK2, CLK3 and CLK4, respectively, by a second set of synchronizers 20, 22, 24 and 26, respectively. The output of these second synchronizers are synchronized signals N12, N22, N32 and N42. By the operation of a plurality of logic gates, described in more detail below, only the selected clock signal, either CLK1, CLK2, CLK3 or CLK4 is allowed to pass to CLK_OUT, thus becoming the new selected clock.

The selected clock of clock switch circuit 10 is switched from selected clock signal CLK1 to CLK2 as follows. When selected clock signal CLK1 is the currently selected CLK_OUT, signal SEL1 is changed from a logic one to a logic zero, and SEL2 is changed from a logic zero to a logic one. Synchronizers 12, 14, 16 and 18 synchronize SEL1, SEL2, SEL3 and SEL4, respectively, to CLK_OUT. Synchronizers 12, 14, 16 and 18 each consist of three latches LATn1, LATn2 and LATn3, wherein n=1, 2, 3 and 4.

A logic one in signal N21, which is synchronous to CLK_OUT, passes through OR gates OR11 and OR12 and NOR gate NOR11, and sets signal N13 to a logic zero, thereby turning off both N channel transistor MN1 and P channel transistor MP1, such that they are open and prevent clock signal CLK1 from passing through to node Z. Previously, when N13 was a logic one, transistors MN1 and MP1 were closed and signal CLK1 was passed to node Z.

At this point, the logic one in N21 needs four more CLK2 phases to pass to N23, so N23 stays at a logic zero. Consequently, N channel transistor MN2 and P channel transistor MP2 are both still turned off. Signals N13, N23, N33 and N43, which are each a logic zero, turn on N channel transistor MN5 by the operation of gates OR1, OR2 and NOR1, which pulls node Z down to a logic zero. As a result, signal CLK_OUT is held at a logic zero. Signals N11, N21, N31 and N41 are CLK_OUT phase zero signals. All the logic gates are turned off and transistor MN5 is turned on in phase zero of signal CLK_OUT. Thus, signal CLK_OUT is synchronously turned off and held at logic zero. Alternatively, signal CLK_OUT can be stopped at logic one by careful design of the synchronizers and the pull down/pull up circuit 36 which holds the logic value of the clock output signal CLK_OUT for a predetermined period of time to prevent a glitch.

The logic zero in signal N11 is then passed through to synchronizer 20, which includes latches LAT14, LAT15, LAT16 and LAT17, and also clock drivers CLKDRV1T and CLKDRV1B, which generate out of phase clock signals CLK1T and CLK1B. The output of latch LAT17 is then inverted by inverter 28 to become signal N12. Similarly, the logic one in signal N21 is passed through the next synchronizer 22, which includes latches LAT24, LAT25, LAT26 and LAT27, and is then inverted by inverter 30 to signal N22 which is synchronous to CLK2. A logic zero in signal N22 sets signal N23 high, and sets signal NOFF low by operation of gates OR1, OR2 and NOR1. The logic one in signal N23 turns both M channel transistor MN2 and P channel transistor MP2 on, thereby turning transistor MN5 off. Signal N23 is a phase zero signal. When clock signal CLK2 passes to signal CLK_OUT, signal CLK_OUT is held at a logic zero. As a result, signal CLK_OUT is synchronously started again.

While clock switch circuit 10 provides glitch-free switching, internal clocks CLKmT and CLKmN, wherein m=1, 2, 3, 4, and CLK_OUTB and CLK_OUTT are toggling all the time to sense the value changes in select signals SEL1, SEL2, SEL3 and SEL4. Signals CLK_OUTB and CLK_OUTT are out-of-phase clock signals generated by signal. CLK_OUT, and by clock drivers DRVB and DRVT, respectively. Since the selected and deselected clocks of switch circuit 10 are not usually switching between themselves, and since each of these clocks are toggling even when they are not switching, they therefore unnecessarily use power.

Figure 2:
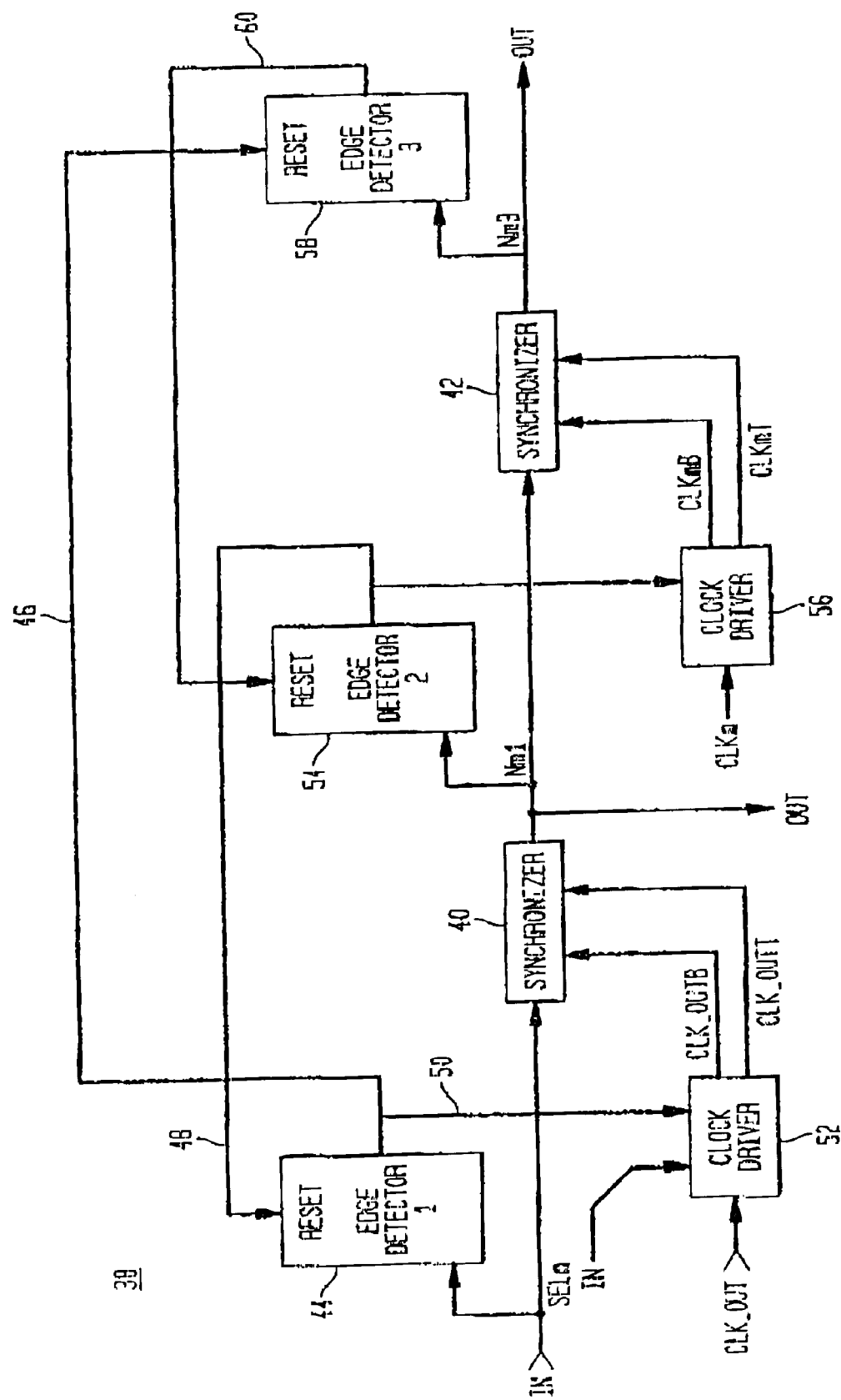
FIG. 2 shows a block diagram of a single clock switch according to an exemplary embodiment of the present invention.

FIG. 2 shows a block diagram of a single clock switch circuit 38 according to an exemplary embodiment of the present invention. The signal selecting the desired clock is SELm, where m is the number of the corresponding clock. Synchronizers 40 and 42 in clock switch circuit 38 perform a similar function as the synchronizers in clock switch circuit 10 shown in FIG. 1. Synchronizer 40 synchronizes signal SELm with the currently selected clock signal CLK_OUT, and second synchronizer 42 synchronizes the first synchronizer output to the corresponding signal CLKm from the currently selected clock or the clock to next be selected.

The input of a first edge detector 44 is coupled to the clock select signal SELm. The output 46 of first edge detector 44 is set to a logic one by any change in the input logic value of signal SELm. The first edge detector 44 output stays high until its reset signal 48 becomes active. When the output of the first edge detector 44 is a logic one, its output clock enable signal 50 turns on a clock driver 52, which receives signal CLK_OUT and generates synchronous signals CLK_OUTB and CLK_OUTT, and also resets edge detector 58. Synchronizer 40 uses the CLK_OUTB and CLK_OUTT signals to synchronize signal SELm with signal CLK_OUT. The input of a second edge detector 54 is coupled to the first synchronizer 40 output signal Nm1 to detect falling or rising edges. Edges in signal Nm1 will set the second edge detector 54 output to a logic one. The second edge detector output is also the first edge detector reset signal 48 of the first edge detector 44, and will thus reset the first edge detector 44 causing the clock enable signal 50 to drop to a logic zero, thereby stopping internal clocks CLK_OUTB and CLK_OUTT.

The second edge detector 54 output is also used to turn on two sets of clock drivers: a first set of clock drivers associated with the clock to be deselected, wherein this set of clock drivers generate both signals CLK_mB and CLK_mT; and a second set of clock drivers associated with the clock to next be selected, wherein this set of clock drivers also generates both signals CLK_mB and CLK_mT. Second synchronizer 42 synchronizes signal Nm1 to the selected/deselected clock signals CLKM. The resulting edge in signal Nm3 is detected by a third edge detector 58 which sets its output 60 to a logic one. This output 60 resets the second edge detector 54, thereby stopping internal clocks CLK_mB and CLK_mT. Thus, clock switch 38 enables the internal clocks when a clock select signal is changed, and stops the internal clocks immediately after the clock switching is complete thereby resulting in power savings because power is not consumed when the clocks are not switched.

Figure 3:
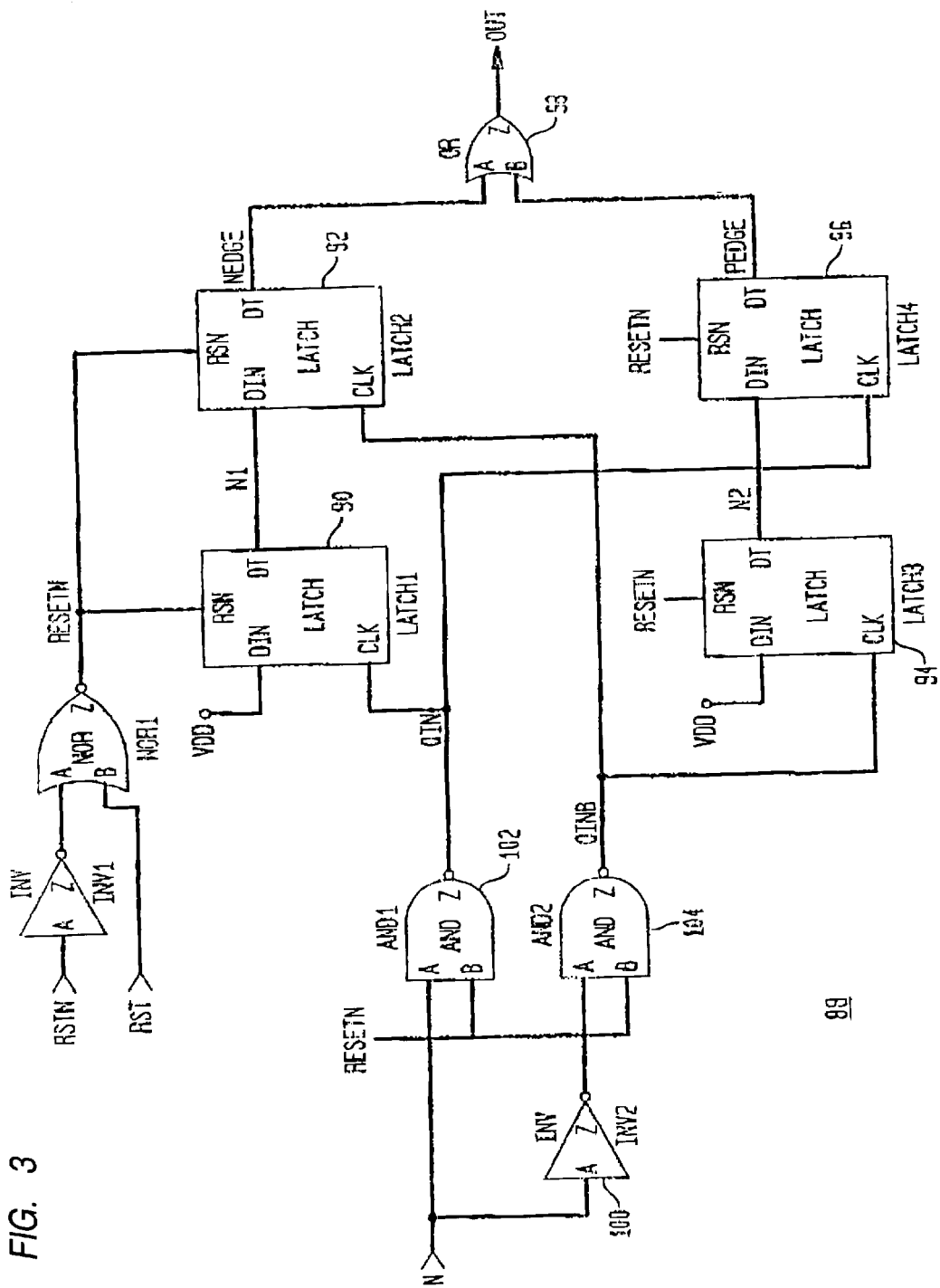
FIG. 3 is a circuit diagram of the low power glitch-free clock switch circuit for switching among four asynchronous clocks according to an exemplary embodiment of the invention.

FIG. 3 shows a circuit diagram of a low power glitch-free clock switch circuit 62 according to an exemplary embodiment of the present invention. Clock switch circuit 62 provides glitch-free operation, as does the conventional clock switch shown in FIG. 1, but clock switch circuit 62 has been modified according to the present invention to provide a power saving mechanism. Clock switch circuit 62 includes four of the clock switches 38 shown in FIG. 2.

The operation of clock switch circuit 62 is subject to the four following constraints. First, the clock select signals SEL1, SEL2, SEL3 and SEL4 are synchronized to a system clock which is not shown and which can be asynchronous to signal CLK_OUT. Second, only one of the select signals is equal to logic one at any one time, and thus only one clock is selected at any given time. Third, clock select signals do not change before the last clock switching is completed. Fourth, only two signals are changed at any one time, a first signal which deselects the currently selected clock, and a second signal which selects the clock to next be selected.

Figure 4:
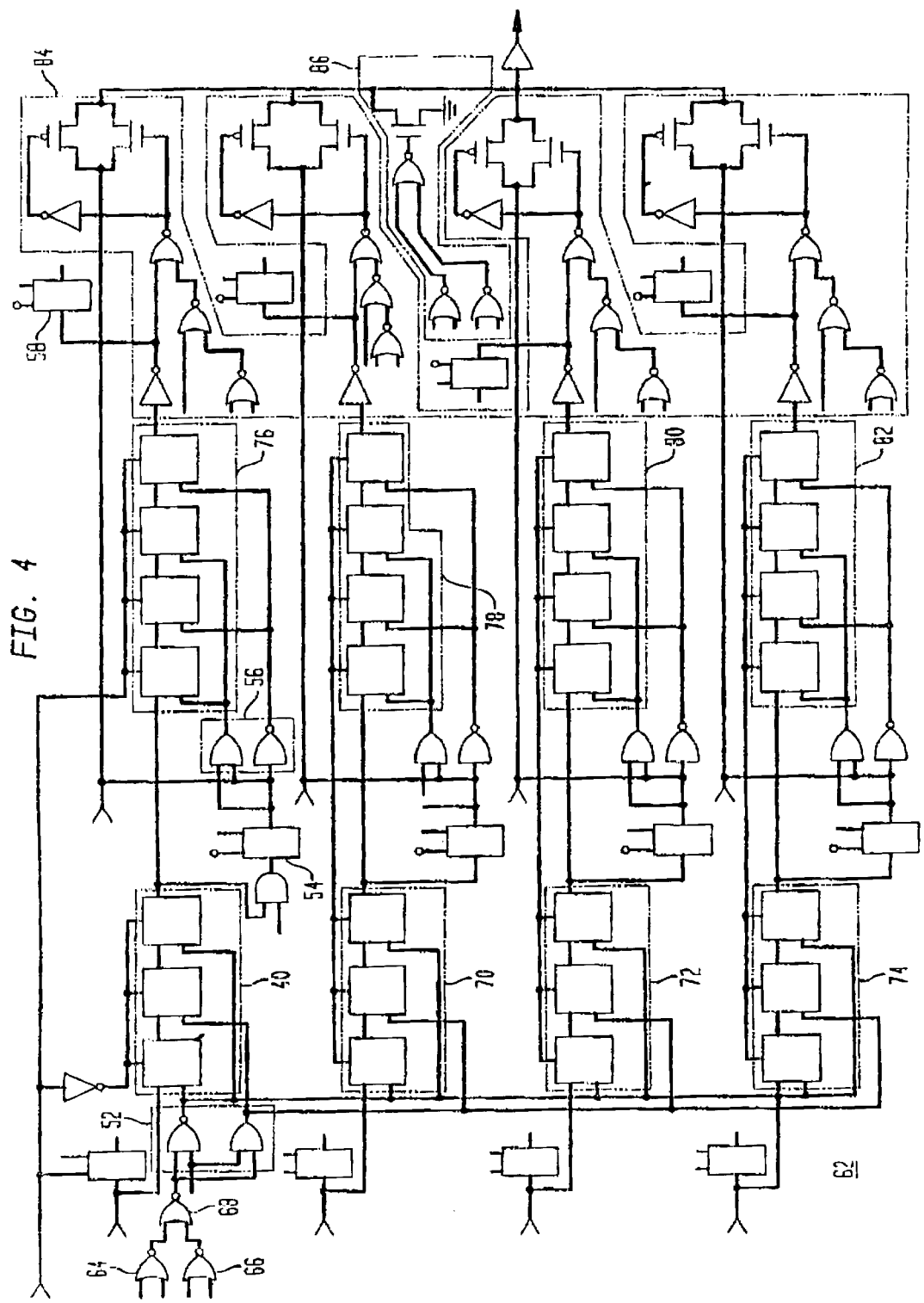
FIG. 4 is a block diagram of an edge detector used in the low power glitch-free clock switch circuit shown in FIG. 3.

The inputs of the four edge detectors EDECT11, EDECT21, EDECT31 and EDECT41 are connected to the select signals SEL1, SEL2, SEL3 and SEL4, respectively. The output of the edge detectors are set to a logic one by any change in the input logic value of the select signals. The edge detectors are shown in FIG. 4 and are discussed in more detail below. The output of the edge detectors stay high until one of their reset signals, RSTN or RST, become active. Consequently, only two of the clock enable signals EN11, EN21, EN31 and EN41, are set to a logic one if the clock select signals are changed. These signals are operated on by OR gates 64, 66 and 68 to generate signal ENCLK_OUT, which is set to a logic one to start clocks CLK_OUTB and CLK_OUTT, and resets edge detectors EDECT13, EDECT23, EDECT33 and EDECT43.

Select signals SEL1, SEL2, SEL3 and SEL4 are asynchronous to signal CLK_OUT, and internal clocks CLK_OUTT AND CLK_OUTB are started asynchronously. While a clock glitch may occur during either the CLK_OUTT or CLK_OUTB signals, such a clock glitch will not affect the normal operation of clock switch circuit 62 because clock select signals SEL1, SEL2, SEL3 and SEL4 are stable earlier than signals EN11, EN21, EN31, and EN41, respectively, Alternatively, the clock select signals stay stable until the switching is completed.

The first set of synchronizers 40, 70, 72 and 74 synchronize clock select signals SEL1, SEL2, SEL3 and SEL4, respectively, to signal CLK_OUT, in the same manner as corresponding synchronizers 12, 14, 16 and 18 in FIG. 1. Likewise, the second set of synchronizers 76, 78, 80 and 82 synchronize the first synchronizer outputs to the corresponding clocks CLK1, CLK2, CLK3 and CLK4, respectively, in the same manner as corresponding synchronizers 20, 22, 24 and 26 shown in FIG. 1.

At least one of the latches in each of the synchronizers 40, 70, 72 and 74 will be closed. Consequently, signals N11, N21, N31 and N41 stay at their previous logic values in the unstable phase of internal clock signals CLK_OUTT and CLK_OUTB. If the length of the first phase of signals CLK_OUTT and CLK_OUTB are too short, the new values in the select signals will not be sensed in the current clock cycle, but will be sensed in the next clock cycle. Signals N11, N21, N31 and N41 are synchronized to signal CLK_OUT by synchronizers 40, 70, 72 and 74, respectively. The inputs of four edge detectors, EDECT12, EDECT22, EDECT32, and EDECT42, are coupled to signals N11, N21, N31 and N41, respectively, to detect falling or rising edges.

In the case where clock CLK1 is deselected and clock CLK2 is selected, the two select signals that are changed, e.g., SEL1 and SEL2, are synchronized to signal CLK_OUT and carried through to signals N11 and N21. The edges in signals N11 and N21 set both clock enable signals EN12 and EN22 to a logic one, respectively. As a result, signals EN12 and EN22 will reset the edge detectors EDECT11 and EDECT21, respectively, and ENCLK_OUT will then drop back to a logic zero. Internal clocks CLK_OUTB and CLK_OUTT are then stopped synchronously because signals N11 and N21 and the falling edge of ENCLK_OUT are synchronized to signal CLK_OUT. The two active clock-enable signals EN12 and EN22 also start two sets of clocks, one to be deselected and one to be selected. In the present example, clocks CLK1T and CLK1B are deselected, and clocks CLK2T and CLK2B are selected, and signal CLK_OUT is the same signal as the clock signal of the currently selected clock, i.e., CLK1. Clocks CLK1T and CLK1B are started synchronously because signal N11 is synchronized to signal CLK_OUT. However, clocks CLK2T and CLK2B are started asynchronously because signal N21 is synchronized to signal CLK_OUT, and signal CLK_OUT is asynchronous with clock CLK2. A short glitch may occur in clock CLK2T or CLK2B. However, the asynchronous start of clocks CLK2T and CLK2B do not affect the normal operation of the circuit, and signal N22 remains synchronized to clock CLK2.

The two changed signals N13 and N23 set the outputs of the two edge detectors EDECT13 and EDECT23 to a logic one, respectively. Clock enable signals EN13 and EN23 are used to reset edge detectors EDECT12 and EDECT22, respectively. Clocks CLK1T, CLK1B, CLK2T and CLK2B are stopped synchronously because signals EN13 and EN23 are synchronized to clocks CLK1 and CLK2, respectively. It is assumed that one of the clocks, e.g., CLK1, is selected after a universal reset is asserted by RSTN. Therefore, latches LAT11, LAT12 and LAT13 are set to a logic one by the RSTN. Edge detector EDECT12 detects the edges of both N11 and RSTN via AND11. Clocks CLK1T and CLKT1B are started on the rising edge of RSTN, and are immediately stopped after logic one is carried from signal N11 to signal N13. Clock CLK1 is therefore selected after the universal reset is asserted by RSTN. Consequently, clock switch circuit 62 of the present invention enables the internal clocks when the clock select signals are changed, and stops the internal clocks immediately after completing the clock switching. While the foregoing example was implemented using four clocks, using more than four clocks in clock switch circuit 62 will enable even more power to be saved. FIG. 3 also includes multiplexer 84 for switching between clock output signals from clocks CLK1, CLK2, CLK3 and CLK4, and pull down/pull up circuit 86.

FIG. 4 shows an embodiment of an edge detector circuit 88 that can be used in the circuit shown in FIG. 3. Two latches, 90 and 92, detect falling edges, and two other latches, 94 and 96, detect rising edges. After a reset is asserted by either signal RSTN or by RST, signals N1, N2, NEDGE and PEDGE are reset to a logic zero. A falling edge carries a logic one to signal NEDGE, while a rising edge carries a logic one to signal PEDGE. Both signals NEDGE and PEDGE go through an OR gate 98 to the output OUT. An inverter 100, and AND gates 102 and 104 generate a qualified phase one clock signal QIN, and a qualified phase zero clock signal QINB. QIN and QINB are off during reset to ensure that there are no DC paths present. RSTN is an active-low signal, and RST is an active-high signal. Other designs for the edge detectors in clock switch circuit 62 may also be employed.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure and method may be varied substantially without departing from the spirit of the invention and the exclusive use of all the modifications which come within the scope of the appended claims is reserved.

What is claimed is:

1. A clock switch circuit for providing a clock output signal selectable from a plurality of clock signals, comprising:

at least three sets of clock drivers wherein two sets of the at least three sets of clock drivers receive clock inputs, a first one of the at least three sets of clock drivers is associated with a currently selected clock, a second one of the at least three sets of clock drivers is associated with a clock to next be selected, and a third one of the at least three sets of clock drivers is associated with a clock output signal;

a plurality of edge detectors which receive a plurality of input signals for selecting clock inputs for turning on each one of the at least three sets of clock drivers in response to a change in a logic value in one of a plurality of clock select signals;

a synchronization means for synchronizing the input select signals to the output clock, and then synchronizing these synchronized signals to each input clock signal;

a first plurality of logic gates for receiving the synchronized clock select signals and the input clock signals and for switching a clock output signal from the currently selected clock to the clock to next be selected synchronously;

a clock driver for receiving the output of the first plurality of logic gates and for outputting the final clock output signal;

a reset means for turning off the at least three sets of clock drivers once the clock output signal has been switched from the currently selected clock to the clock to next be selected, whereby the at least three sets of clock drivers are inactive until a logic value in a second one of the plurality of clock select signals changes, thereby preserving power when the circuit is not switching; and a means for pulling the final clock to the desirable logic level when the clock is not stable during switching.

2. The clock switch circuit according to claim 1, wherein the plurality of edge detectors comprise:

a first edge detector for receiving the first one of the plurality of clock select signals and generating a first edge detector output signal coupled to the third one of the at least three sets of clock drivers;

a second edge detector for receiving a signal derived from the first one of the plurality of clock select signals and generating a second edge detector output signal coupled to both the first one and the second one of the at least three sets of clock drivers and resetting the first edge detector, thereby turning off the clock driver associated with an output clock; and a third edge detector for receiving a signal derived from the first one of the plurality of clock select signals and generating a third edge detector output signal for resetting the second edge detector, thereby turning off the first one and the second one of the at least three sets of clock drivers, and the first edge detector output signal resetting the third edge detector.

3. The clock switch circuit according to claim 2, wherein each edge detector comprises:

a pair of latches for detecting falling edges;

a pair of latches for detecting rising edges; and a second plurality of logic gates for generating an edge detector output if either a falling or a rising edge is detected.

4. The clock switch circuit according to claim 2, further comprising:

a first synchronizer for synchronizing the first one of the plurality of clock select signals with the currently selected clock; and a second synchronizer for synchronizing an output signal from the first synchronizer with both the currently selected clock and the clock to next be selected.

5. The clock switch circuit according to claim 4, wherein both the first synchronizer and the second synchronizer are each comprised of a plurality of latches.

6. The clock switch circuit according to claim 5, wherein the clock switch circuit is configured to receive a plurality of clock input signals, and wherein at least two of the plurality of clock input signals are asynchronous with one another.

7. The clock switch circuit according to claim 4, wherein the third one of the at least three sets of clock drivers receives both the first edge detector output signal and the clock output signal and generates a first intermediate clock signal derived from the clock output signal, the first intermediate clock signal being coupled to the first synchronizer, wherein the first one of the plurality of clock select signals is synchronized by the first synchronizer with the first intermediate clock signal, wherein the first one of the at least three sets of clock driver receives both the second edge detector output signal and a signal from the currently selected clock and generates a second intermediate clock signal derived from the signal from the currently selected clock, the second intermediate clock signal being coupled to the second synchronizer, wherein the output signal from the first synchronizer is synchronized by the second synchronizer with the second intermediate clock signal, wherein the second one of the at least three sets of clock drivers receives both the second edge detector output signal and a signal from the clock to next be selected and generates a third intermediate clock signal derived from the signal from the clock to next be selected, the third intermediate clock signal being coupled to the second synchronizer, wherein the output signal from the first synchronizer is synchronized by the second synchronizer with the third intermediate clock signal.

8. The clock switch circuit according to claim 7, wherein the first plurality of logic gates for switching the clock output signal from the currently selected clock to the clock to next be selected comprises a gate coupled to an output of the second synchronizer and to each one of the at least two of the plurality of clock input signals from the selected clock, the gate switching the clock output signal from the currently selected clock to the clock to next be selected only when the first one of the plurality of clock select signals has a logical one and passes through the second synchronizer.

9. The clock switch circuit according to claim 8, wherein the first plurality of logic gates includes at least two transistors and at least one NOR gate.

10. A low power, glitch-free clock switching circuit for an integrated circuit having a plurality of asynchronous clocks, comprising:

a first edge detector for detecting an input clock select signal;

a first synchronizer for synchronizing the input clock select signal with a signal from an output clock;

a first providing means for providing a first clock signal to the first synchronizer, the first clock signal being derived from the signal from the output clock;

a second edge detector for detecting the synchronized clock select signal output by the first synchronizer, the second edge detector being configured to switch the first clock signal off after the first synchronizer completes its operation;

a second synchronizer for synchronizing the synchronized clock select signal output by the first synchronizer with the currently selected clock and the clock to next be selected;

a second providing means for providing a second clock signal to the second synchronizer, the second clock signal being derived from the clock input signals;

a third edge detector for detecting the output of the second synchronizer, the third edge detector being configured to switch the second clock signal off after the second synchronizer completes its operation, and the first synchronizer resetting the third edge detector, wherein the first clock signal and the second clock signal are switched off until a change in a logic value of the clock select signal, thereby preserving power when the circuit is not switching;

a first switching means for receiving the output of the second synchronizer and the clock input signals, and for switching the clock output from the currently selected clock to the clock next to be selected; and a means for pulling the clock output to a desirable level after all the clock select signals pass the first synchronizer and before all the clock select signals pass the second synchronizer so that the output clock does not have glitches while switching.

11. The low power, glitch-free clock switching circuit according to claim 10, wherein the first providing means comprises a first set of clock drivers for receiving the signal from the clock output and generating the first clock signal, wherein the second providing means comprises a second set of clock drivers for receiving the signal from the currently selected clock and generating the second clock signal, and wherein the third providing means comprises a third set of clock drivers for receiving the signal from the clock to next be selected and generating the third clock signal.

12. The low power, glitch-free clock switching circuit according to claim 11, wherein the first edge detector receives the clock select signal and generates a first output signal switching on the first set of clock drivers and resetting the third edge detector, wherein the second edge detector receives the synchronized clock select signal and generates a second output signal both switching on the second and third sets of clock drivers and resetting the first edge detector, thereby switching off the first set of clock drivers, and wherein the third edge detector receives an output signal from the second synchronizer and generates a third output signal resetting the second edge detector, thereby switching off the second and third set of clock drivers.

13. The low power, glitch-free clock switching circuit according to claim 12, wherein the first edge detector, the second edge detector and the third edge detector each comprise:
   a first pair of latches for detecting falling edges;
   a second pair of latches for detecting rising edges; and
   a plurality of logic gates for generating an output if either a falling edge or a rising edge is detected.

14. The improved clock switching circuit according to claim 13, wherein the first synchronizer and the second synchronizer are each comprised of a plurality of latches.

15. The low power, glitch-free clock switching circuit according to claim 14, wherein the improved clock switch circuit is configured to receive a plurality of clock select signals, and wherein at least two of the plurality of clock select signals are synchronous with one another.

16. The low power, glitch-free clock switching circuit according to claim 15, wherein the first set of clock drivers receives both the first output signal and the signal from the clock output, and wherein the first clock signal is synchronous with the signal from the clock output and is coupled to the first synchronizer, the clock select signal being synchronized by the first synchronizer with the first clock signal, and wherein the second set of clock drivers receives both the second output signal and the signal from the currently selected clock, the synchronized clock select signal being synchronized by the second synchronizer with the second clock signal, and wherein the third set of clock drivers receives both the second output signal and the signal from the clock to next be selected, the synchronized clock select signal being synchronized by the second synchronizer with the third clock signal.

17. The low power, glitch-free clock switching circuit according to claim 10, further comprising a plurality of logic gates for switching a clock output signal from the currently selected clock to the clock to next be selected only when the clock select signal has a logical one and passes through the second synchronizer.

18. The low power, glitch-free clock switching circuit according to claim 17, wherein the plurality of logic gates includes at least two transistors and at least one NOR gate.

19. A low power, glitch-free clock switching integrated circuit for selecting one of at least two clock signals as a clock output signal, comprising:

a first edge detector for detecting an input clock select signal and generating a first edge detector output signal in response to changes in the clock select signal;

a first set of clock drivers for receiving both the first edge detector output signal and a clock output signal and generating a first intermediate clock signal derived from the clock output signal;

a first synchronizer for synchronizing the input clock select signal with the first intermediate clock signal;

a second edge detector for detecting the synchronized clock select signal output by the first synchronizer and generating a second edge detector output signal for resetting the first edge detector, thereby turning off the first set of clock drivers;

a second set of clock drivers for receiving both the second edge detector output signal and an input clock signal which is the currently selected clock, and generating a second intermediate clock signal derived from the signal from the currently selected clock;

a second synchronizer for receiving both the synchronized clock select signal output by the first synchronizer and the second intermediate clock signal, and for synchronizing the synchronized clock select signal with the second intermediate clock signal;

a third edge detector for detecting a change in the output of the second synchronizer and generating a third edge detector output signal for resetting the second edge detector, thereby turning off the second set of clock drivers, and the first edge detector output signal resetting the third edge detector;

a third set of clock drivers for receiving both the second edge detector output signal and an input clock signal which is the clock to next be selected, and generating a third intermediate clock signal derived from the signal from the clock to next be selected;

a third synchronizer for receiving both the synchronized clock select signal output by the first synchronizer and the third intermediate clock signal, and synchronizing the synchronized clock select signal with the third intermediate clock signal;

a fourth edge detector for detecting a change in the output of the third synchronizer and generating a fourth edge detector output signal for resetting the third edge detector, thereby turning off the third set of clock drivers, and the first edge detector output signal resetting the fourth edge detector wherein the three sets of clock drivers are inactive until a logic value in the clock select signal changes, thereby preserving power when the circuit is not switching;

a plurality of logic gates receiving the clock input signals and the output of the second and third synchronizers, the outputs of the second and third synchronizers opening and closing the transmission gates to switch the clock output from the currently selected clock to the clock to next be selected; and a plurality of logic gates for pulling the clock output to a desirable level after all the clock select signals pass the first synchronizer and before all the clock select signals pass the second synchronizer so that the output clock does not have glitches while switching.

20. The integrated circuit according to 19, wherein the integrated circuit is an application specific integrated circuit.

* * * * *